United States Patent [19]

Watarai et al.

[11] Patent Number: 4,636,806
[45] Date of Patent: Jan. 13, 1987

[54] RECORDING MEDIUM

[75] Inventors: Hisao Watarai, Copo Shoen 203, 5-1-13, Yagiyamaminami, Sendai-shi, Miyagi; Masahiro Tanaka, 3-9-24, Kagitori, Sendai-shi, Miyagi; Shuji Masuda, 27-8, Ejiri Aza Miyanomoto, Kitajimamachi, Itano-gun, Tokushima; Kenji Suzuki, 11-12-12, Shogen, Izumi-shi, Miyagi; Tsuyoshi Masumoto, 3-8-22, Kamisugi, Sendai-shi, Miyagi, all of Japan

[73] Assignees: Research Development Corporation of Japan, Tokyo; Hisao Watarai, Sendai; Masahiro Tanaka, Sendai; Shuji Masuda, Tokushima; Kenji Suzuki, Izumi; Tsuyoshi Masumoto, Sendai, all of Japan

[21] Appl. No.: 717,754

[22] Filed: Mar. 29, 1985

[30] Foreign Application Priority Data

Mar. 30, 1984 [JP] Japan .................................. 59-061157

[51] Int. Cl.$^4$ ............................................... G11B 7/24
[52] U.S. Cl. ................................... 346/1.1; 346/76 L; 346/135.1; 428/702; 428/913; 430/945

[58] Field of Search ....................... 428/694, 702, 913; 252/62.63, 62.62; 430/945; 346/76 L, 135.1

[56]  References Cited

U.S. PATENT DOCUMENTS

| | | | |
|---|---|---|---|
| 3,532,630 | 10/1970 | Tenzer | 252/62.62 |
| 4,323,621 | 4/1982 | Kober et al. | 428/692 |
| 4,341,863 | 7/1982 | Borrelli et al. | 430/945 |
| 4,357,616 | 11/1982 | Terao et al. | 430/945 |

FOREIGN PATENT DOCUMENTS

| | | | |
|---|---|---|---|
| 74830 | 5/1982 | Japan | 428/694 |
| 2026981 | 2/1980 | United Kingdom | 430/945 |

*Primary Examiner*—George F. Lesmes
*Assistant Examiner*—William M. Atkinson
*Attorney, Agent, or Firm*—Flynn, Thiel, Boutell & Tanis

[57]  ABSTRACT

A recording medium is disclosed, which comprises as the main component an amorphous lead oxide or a lead oxide at the metastable state, having the formula of $PbL_xM_yO_z$ wherein L and M each indicate elements other than Pb and O. The recording mediums are drastically changed in their electrical properties and optical properties by application of heat, due to the characteristics inherent in the main component, and such changes make the recording medium highly useful for recording by laser light or heat.

13 Claims, 6 Drawing Figures

RECORDING MEDIUM

BACKGROUND OF THE INVENTION

The present invention relates to a recording medium for recording information therein in a heating mode recording by application of laser and utilizing the light as heat or by electric current for generating Joule's heat.

As conventional recording mediums for recording information therein, there are known a magnetic recording medium, recording mediums with a metal having a low melting point and capable of recording by perforating therein by application of laser beam, and recording mediums containing a chalcogenide amorphous semiconductor as the main component, a recording medium containing Te as the main component, and a recording medium containing $VO_2$ as the main component.

The recording density of a magnetic recording medium is smaller by approximately one order of magnitude than that of an optical recording medium. Furthermore, a magnetic recording medium has, for example, the shortcoming that the recording medium itself wears because it is used in contact with a head. The recording mediums of metal with a low melting point and, the recording mediums containing as the main component a chalcogenide amorphous semi-conductor or Te have the shortcoming that the recording mediums deteriorate due to the oxidation thereof when exposed to the air. The recording medium containing $VO_2$ as the main component has the shortcoming that it must be always maintained at temperatures of 50° C. to 80° C. in order to keep recorded information. If the recording medium with information recorded therein is placed in the atmosphere at room temperature, the recorded information will be lost.

SUMMARY OF THE INVENTION

It is therefore an object of the present invention to provide a recording medium from which the above described conventional shortcomings are eliminated and which can keep recorded information in a stable manner.

This object of the present invention is attained by a recording medium containing as the main component an amorphous lead oxide or a metastable phase lead oxide having a formula of $PbL_xM_yO_z$ wherein L and M each represent elements other than Pb and O, $0 \leq x+y \leq 2$, $1 \leq z \leq 7$.

DETAILED DESCRIPTION OF THE PREFERRED EMBODIMENTS

An amorphous lead oxide and a metastable phase of lead oxide are stable at temperatures of 100° C. or lower. By application of heat to such lead oxides, the structural changes or changes in the content of oxygen, or changes in the shape of the recording medium by utilizing its low melting point are caused, so that such lead oxides can be transferred to a stable phase, thereby causing changes in the optical characteristics and electric characteristics thereof to attain stable retaining of recorded information.

Such amorphous lead oxide and metastable phase of lead oxide can be prepared by reactive sputtering.

The lead oxides for use in the present invention perform their function sufficiently when at least one element selected from the group consisting of iron family elements, niobium and tantalum is contained.

When only iron family elements are contained, that is, when $x \neq 0$ and $y=0$, an iron-family-element - lead type compound having the formula of $PbL_xO_z$ (where L is at least one element selected from the group consisting of Fe, Co and Ni, $0.21 \leq x \leq 1.5$ and $1 \leq z \leq 4.25$) is suitable for use in the present invention. In particular, when $x \leq 1.0$, the properties are excellent.

When niobium or tantalum is contained, that is, when $x=0$ and $y \neq 0$, a compound having the formula of $PbM_yO_z$ (where M is at least one element selected from the group consisting of Nb and Ta, $0 < y \leq 1.5$, and $1 < z \leq 5.75$) is suitable for use in the present invention.

When iron family elements and niobium or tantalum are contained, that is, when $x \neq 0$ and $y \neq 0$, a compound having the formula of $PbL_xM_yO_z$ (wherein $0 < x+y \leq 2$ and $1 < z \leq 7$) is suitable for use in the present invention.

By referring to the following examples, the present invention will now be explained in more detail.

EXAMPLE 1

A recording medium having a composition of $PbFe_{0.2}O_{2.3}$ was prepared by reactive sputtering of iron and lead in the presence of oxygen.

Figure 1:
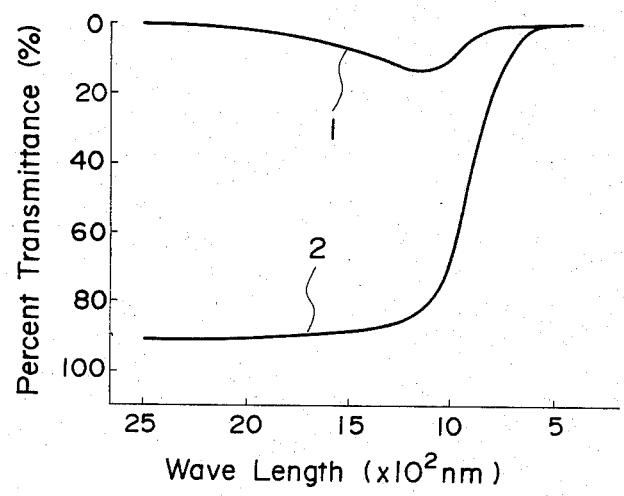
FIG. 1 is a graph showing the light transmittance of an embodiment of a recording medium according to the present invention.

The optical properties of this recording medium were as shown in FIG. 1. In the figure, a curve having reference numeral 1 indicates the percent transmittance of the recording medium which was not subjected to heat treatment and a curve having reference numeral 2 indicates the percent transmittance of the recording medium which was subjected to heat treatment at 180° C. for several ten seconds. As can be seen from the graph in this figure, the light transmittance of the recording medium significantly changed by the heat treatment. The recording medium allows writing with good contrast by application of laser beams having relatively low energy in a wide range of wave length.

Figure 2:
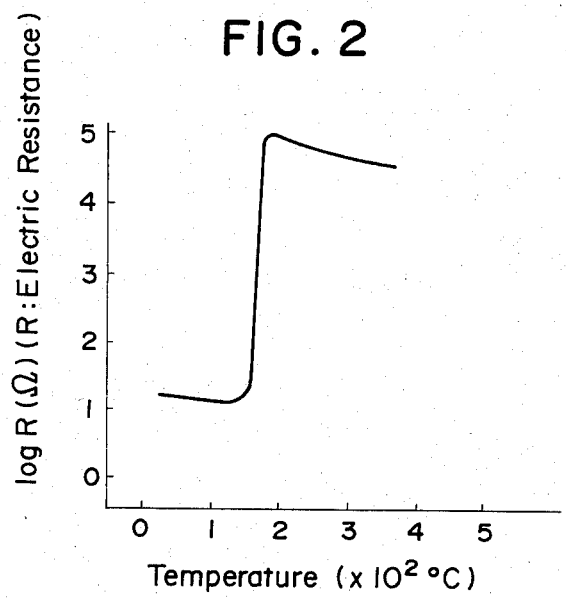
FIG. 2 is a graph showing the change in electric resistance (at a logarithmic scale) due to a temperature change for the recording medium shown in FIG. 1.

FIG. 2 shows the change in electric resistance versus a temperature change for the recording medium. At temperatures around 150° C., the electric resistance changed by about four orders of magnitude, which indicated that this recording medium has a memory function.

EXAMPLE 2

A recording medium having a composition of $PbNb_{0.5}O_{2.67}$ was prepared by reactive sputtering of niobium and lead in the presence of oxygen.

Figure 3:
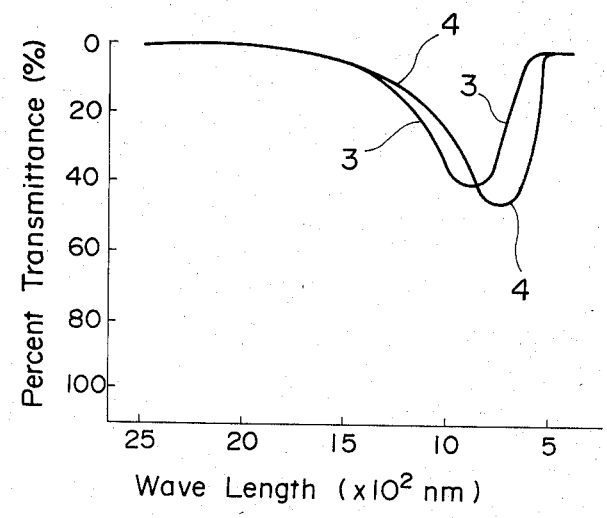
FIG. 3 is a graph showing the light transmittance of another embodiment of a recording medium according to the present invention.

The optical properties of this recording medium was as shown in FIG. 3. In the figure, a curve having reference numeral 3 indicates the percent transmittance of the recording medium which was not subjected to heat treatment and a curve having reference numeral 4 indicates the percent transmittance of the recording medium which was subjected to heat treatment at 250° C. for several ten seconds. As can be seen from the graph in this figure, the percent transmittance of the recording medium significantly changed in a wave length region of 550 nm to 700 nm by the heat treatment and the recording medium made possible writing therein in a heating mode in the visible wave length range.

Figure 4:
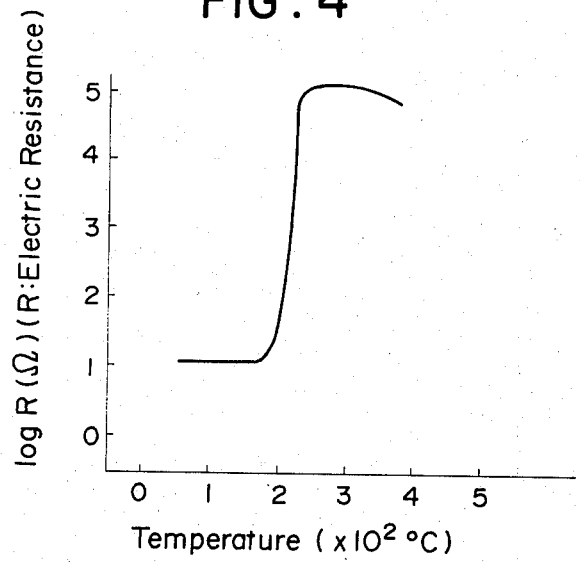
FIG. 4 is a graph showing the change in electric resistance (at a logarithmic scale) due to a temperature change for the recording medium shown in FIG. 3.

FIG. 4 shows the change in electric resistance due to a temperature change for recording medium. At temperatures around 200° C., the electric resistance changed about four orders of magnitude and the recording medium was found to have an excellent memory function.

EXAMPLE 3

A recording medium having a composition of $PbFe_{0.18}Nb_{0.22}O_{2.24}$ was prepared by reactive sputtering of lead, iron and niobium in the presence of oxygen.

Figure 5:
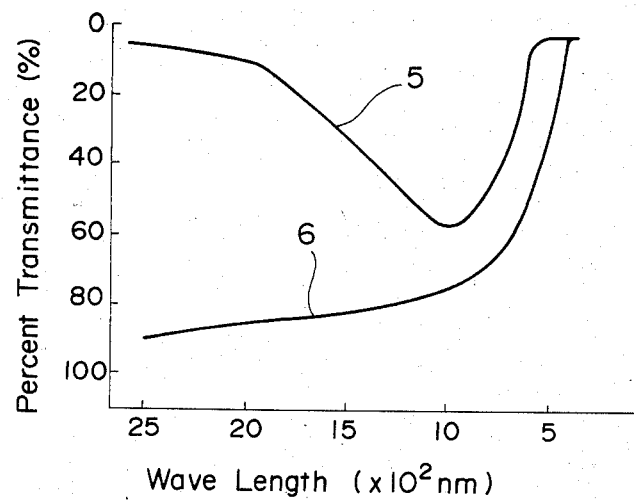
FIG. 5 is a graph showing the light transmittance of a further embodiment of a recording medium according to the present invention.

The optical properties of this recording medium was as shown in FIG. 5. In the figure, a curve having reference numeral 5 indicates the percent transmittance of the recording medium which was not subjected to heat treatment and a curve having reference numeral 6 indicates the percent transmittance of the recording medium which was subjected to heat treatment at 390° C. for several ten seconds. As can be seen from the graph in this figure, the percent transmittance of the recording medium significantly changed by the heat treatment and the recording medium made possible the attainment of writing with good contrast in a wide wave length range.

Figure 6:
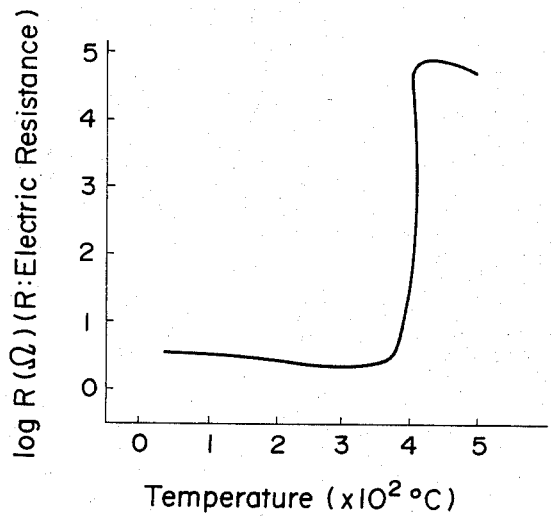
FIG. 6 is a graph showing the change in electric resistance (at a logarithmic scale) due to a temperature change for recording medium shown in FIG. 5.

FIG. 6 shows the change in the electric resistance due to a temperature change for the recording medium. At temperatures around 380° C., the electric resistance changed by about 4.5 orders of magnitude and this recording medium was found to have an excellent memory function.

The optical characteristics of the recording mediums according to the present invention can be significantly changed in a visible light range by application of heat at relatively low temperatures of 150° C. to 200° C., using an appropriate choice of the compositions, even if changes in the electric resistance are only about one-half orders of magnitude. Specific examples of such recording mediums are  $PbFe_{0.25}Nb_{0.15}O_{2.3}$ and $PbFe_{0.40}Nb_{0.36}O_{3.1}$. These are both amorphous.

In the above Examples, iron and/or niobium is added to the metastable phase of lead oxide. In addition to these Examples, a recording medium was prepared by reactive sputtering of only the metastable phase of lead oxide in the presence of oxygen, without containing iron and/or niobium. In contrast to the above Examples, the changes in the electric resistance of the recording medium in this example decreased drastically by two orders by application of heat at 270° C. and the optical properties of the medium also changed by application of heat in the wave length range of more than 800 nm, exhibiting useful characteristics as recording medium.

Further it was confirmed that pits with a diameter of 0.8 μm can be formed in the recording mediums according to the present invention by application of laser beams of 20 mW having a wave length of 488 nm for 500 nsec. This is because of metastable phase of lead oxide, which is the main component of the recording medium, has a low melting point and a low viscosity.

The recording mediums according to the present invention can be used in any recording modes by utilizing the changes in the optical properties, the changes in the electric properties and the changes in the shape because of the particular characteristics of the main component of the recording medium. Further, since the melting point of the main component is low, pit formation can be easily carried out. In addition to this, since the main component is lead oxide, its heat conductivity is low and its heat diffusion is small. Therefore, high resolution can be obtained in the recording by utilizing heat. Furthermore, the main component is a stable material to oxidation, it is not always necessary to form a protective layer made of a material other than the lead oxide on the surface of the recording medium.

The recording mediums according to the present invention are extremely useful for the application to large capacity optical disc file system, optical-electrical memory elements and thermal-electric memory elements.

What is claimed is:

1. A heat-sensitive and laser light-sensitive recording medium comprised of a reactively-sputtered coating upon a substrate, said coating consisting essentially of an amorphous or metastable lead oxide composition having the formula $$PbL_xO_z$$

wherein L is at least one element selected from the group consisting of Fe, Co and Ni, $$0 < x \leq 1.5$$

$$1 \leq z \leq 4.25$$

said lead oxide composition being convertible to a stable state and simultaneously the light transmittance and/or electrical resistance of said lead oxide composition are changed, by application of heat or laser light to said recording medium.

2. A recording medium as claimed in claim 1, in which $$X \leq 1.0.$$

3. A recording medium as cliamed in claim 1, in which said lead oxide composition has the formula

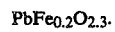 $PbFe_{0.2}O_{2.3}$.

4. A method of recording information, comprising applying to the recording medium as claimed in claim 1, a heat and/or laser light pattern indicative of encoded information to convert said medium from its amorphous or metastable state to a stable state and thereby record the encoded information on the medium.

5. A heat-sensitive and laser light-sensitive recording medium comprised of a reactively-sputtered coating upon a substrate, said coating consisting essentially of an amorphous or metastable lead oxide composition having the formula $$PbM_yO_z$$

wherein M is at least one element selected from the group consisting of Nb and Ta, $$0 < y \leq 1.5,$$

$$1 < z \leq 5.75$$

said least oxide composition being convertible to a stable state and simultaneously the light transmittance and/or electrical resistance of said lead oxide composition are changed, by application of heat or laser light to said recording medium.

6. A recording medium as claimed in claim 5 in which said lead oxide composition has the formula $$PbNb_{0.5}O_{2.67}.$$

7. A method of recording information, comprising applying to the recording medium as claimed in claim 5, a heat and/or laser light pattern indicative of encoded information to convert said medium from its amorphous or metastable state to a stable state and thereby record the encoded information on the medium.

8. A heat-sensitive and laser light-sensitive recording medium comprised of a reactively-sputtered coating upon a substrate, said coating consisting essentially of an amorphous or metastable lead oxide composition having the formula $$PbL_xM_yO_z$$

wherein L is at least one element selected from the group consisting of Fe, Co and Ni, M is at least one element selected from the group consisting of Nb and Ta, $$0 < x + y \leq 2$$

and $$1 < z \leq 7,$$

said lead oxide composition being convertible to a stable state and simultaneously the light transmittance and/or electrical resistance of said lead oxide composition are changed, by application of heat or laser light to said recording medium.

9. A recording medium as claimed in claim 8 in which $x \neq 0$ and $y \neq 0$.

10. A recording medium as claimed in claim 9 in which said lead oxide composition has the formula $$PbFe_{0.18}Nb_{0.22}O_{2.24}.$$

11. A recording medium as claimed in claim 9 in which said lead oxide composition has the formula $$PbFe_{0.25}Nb_{0.15}O_{2.3}.$$

12. A recording medium as claimed in claim 9 in which said lead oxide composition has the formula $$PbFe_{0.4}Nb_{0.31}O_{3.1}.$$

13. A method of recording information, comprising applying to the recording medium as claimed in claim 1, a heat and/or laser light pattern indicative of encoded information to convert said medium from its amorphous or metastable state to a stable state and thereby record the encoded information on the medium.

* * * * *